US010915028B2

(12) United States Patent
Hiki et al.

(10) Patent No.: US 10,915,028 B2
(45) Date of Patent: Feb. 9, 2021

(54) THERMOSETTING COLORING COMPOSITION AND METHOD OF PRODUCING COLOR FILTER FOR SOLID-STATE IMAGING ELEMENT

(71) Applicants: TOYO INK SC HOLDINGS CO., LTD., Tokyo (JP); TOYOCOLOR CO., LTD., Tokyo (JP); TOPPAN PRINTING CO., LTD, Tokyo (JP)

(72) Inventors: Kenji Hiki, Tokyo (JP); Tomohiro Imoto, Tokyo (JP); Satoshi Takahashi, Tokyo (JP)

(73) Assignees: TOYO INK SC HOLDINGS CO., LTD., Tokyo (JP); TOYOCOLOR CO., LTD., Tokyo (JP); TOPPAN PRINTING CO., LTD., Tokyo (JP)

( * ) Notice: Subject to any disclaimer, the term of this patent is extended or adjusted under 35 U.S.C. 154(b) by 273 days.

(21) Appl. No.: 16/033,236

(22) Filed: Jul. 12, 2018

(65) Prior Publication Data
US 2018/0321591 A1 Nov. 8, 2018

Related U.S. Application Data

(63) Continuation of application No. PCT/JP2017/000676, filed on Jan. 11, 2017.

(30) Foreign Application Priority Data

Jan. 14, 2016 (JP) .................... 2016-004926

(51) Int. Cl.
| | |
|---|---|
| *G02B 5/20* | (2006.01) |
| *G03F 7/42* | (2006.01) |
| *G03F 7/00* | (2006.01) |
| *G03F 7/033* | (2006.01) |
| *G03F 7/16* | (2006.01) |
| *G03F 7/20* | (2006.01) |
| *G03F 7/26* | (2006.01) |
| *H01L 27/146* | (2006.01) |

(52) U.S. Cl.
CPC .............. *G03F 7/425* (2013.01); *G02B 5/20* (2013.01); *G03F 7/0007* (2013.01); *G03F 7/033* (2013.01); *G03F 7/162* (2013.01); *G03F 7/168* (2013.01); *G03F 7/20* (2013.01); *G03F 7/26* (2013.01); *G03F 7/426* (2013.01); *H01L 27/14621* (2013.01); *H01L 27/14685* (2013.01)

(58) Field of Classification Search
CPC ......... G03F 7/0007; G02B 5/20; G02B 5/201; G02B 5/223; G02F 1/133514; G02F 1/133516; H01L 27/14621; H01L 27/14685
USPC .............................. 430/7; 349/106; 257/440
See application file for complete search history.

(56) References Cited

U.S. PATENT DOCUMENTS

| | | | | |
|---|---|---|---|---|
| 2014/0211334 A1* | 7/2014 | Yoshibayashi | .......... | G02B 5/23 359/891 |
| 2015/0316844 A1 | 11/2015 | Samejima et al. | | |
| 2016/0327710 A1 | 11/2016 | Murakami | | |

FOREIGN PATENT DOCUMENTS

| | | |
|---|---|---|
| CN | 101218017 | 7/2008 |
| CN | 101441413 | 5/2009 |
| CN | 104995255 | 10/2015 |
| JP | S5715620 | 1/1982 |
| JP | S5940172 | 3/1984 |
| JP | S6317102 | 1/1988 |
| JP | S63305173 | 12/1988 |
| JP | H059469 | 1/1993 |
| JP | 2937208 | 8/1999 |
| JP | 2002114907 | 4/2002 |
| JP | 2003332310 | 11/2003 |
| JP | 2008029901 | 2/2008 |
| JP | 2008216970 | 9/2008 |
| JP | 2009185277 | 8/2009 |
| JP | 2010100789 | 5/2010 |
| JP | 2011148910 | 8/2011 |
| JP | 2013023561 | 2/2013 |
| JP | 2014149506 | 8/2014 |
| JP | 2014215474 | 11/2014 |
| JP | 2015151467 | 8/2015 |
| TW | 201531534 | 8/2015 |
| WO | 2007007685 | 1/2007 |
| WO | 2008007776 | 1/2008 |

OTHER PUBLICATIONS

Computer-generated translation of JP 2002-114907, with abstract (Apr. 2002). (Year: 2002).*
"International Search Report (Form PCT/ISA/210) of PCT/JP2017/000676," dated Mar. 21, 2017, with English translation thereof, pp. 1-5.
"Search Report of Europe Counterpart Application", dated May 28, 2019, p. 1-p. 8.
International Preliminary Report on Patentability; this report contains the following items :Form PCT/IB/338, PCT/IB/373, PCT/ISA237(cover sheet), PCT/ISA237(Box No. I),PCT/ISA237(Box No. V), dated Jul. 26, 2018, which is English translation of "Written Opinion of the International Searching Authority", p. 1-p. 11.

(Continued)

*Primary Examiner* — John A McPherson
(74) *Attorney, Agent, or Firm* — JCIPRNET

(57) ABSTRACT

A thermosetting coloring composition for manufacturing a color filter for a solid-state imaging element provided with a colored pattern formed by patterning a colored layer by dry etching is provided. The composition contains a pigment (A), a dispersant (B), a thermosetting compound (C), and a solvent (D). A ratio of the pigment (A) to a total solid content of the thermosetting coloring composition is 50 mass percent or more. The dispersant (B) contains a dispersant (b1) having an acidic functional group and/or a dispersant (b2) having a basic functional group. The thermosetting compound (C) contains a glycidyl therified epoxy compound of sorbitol.

11 Claims, 2 Drawing Sheets

(56) References Cited

OTHER PUBLICATIONS

"Office Action of China Counterpart Application", dated Mar. 25, 2020, with English translation thereof, pp. 1-16.
Office Action of Japan Counterpart Application, with English translation thereof, dated Jun. 2, 2020, pp. 1-8.
Office Action of Taiwan Counterpart Application, with English translation thereof, dated Jun. 5, 2020, pp. 1-11.
"Office Action of Europe Counterpart Application", dated Sep. 15, 2020, p. 1-p. 5.

\* cited by examiner

THERMOSETTING COLORING COMPOSITION AND METHOD OF PRODUCING COLOR FILTER FOR SOLID-STATE IMAGING ELEMENT

CROSS-REFERENCE TO RELATED APPLICATIONS

This application is a Continuation Application of PCT Application No. PCT/JP2017/000676, filed Jan. 11, 2017, and is based upon and claims the benefit of priority from Japanese Patent Application No. 2016-004926, filed Jan. 14, 2016, the entire contents of all of which are incorporated herein by reference.

FIELD

The present invention relates to a thermosetting coloring composition for manufacturing a color filter used in a solid-state imaging element, and particularly relates to a thermosetting coloring composition useful for a thin film and high definition. The present invention also relates to a method of producing a color filter formed by using the thermosetting coloring composition for a color filter.

BACKGROUND

A solid-state imaging element is provided with a color filter in which organic pixels of a plurality of colors such as red pixels, green pixels, and blue pixels are two-dimensionally arranged on a substrate such as a semiconductor substrate. Recently, in solid-state imaging elements, along with the reduction in pixel size, performance requirements for color separation are becoming higher, and in order to maintain device characteristics such as color shading characteristics and color mixing prevention, the performance for a color filter requires thinning, rectangularity, and not having an overlapped region where colors are overlapped between each organic pixel.

Specifically, in a color filter for a solid-state imaging element, the thickness tends to be, for example, 1 μm or less for the thinning of an organic pattern, and the pixel pattern size tends to be 2 μm or less (for example, 0.5 to 2.0 μm), thereby achieving a microsize.

In particular, recently, there has been a demand for the higher definition of the color filter for the solid-state imaging element, and the formability of a pattern of, for example, 1.0 μm or less has been demanded, and it has been difficult to avoid the trade-off between the thinning and the resolution of the color filter in the conventional photolithography.

On the other hand, dry etching has been proposed to form an organic pattern.

However, when the dry etching is adopted, there is a problem that the photoresist remaining after the dry etching process needs to be stripped off with a stripping liquid, and this stripping liquid may damage an organic film layer.

SUMMARY

The present invention has been made in view of the foregoing problems, and an object is to provide a thermosetting coloring composition for manufacturing a color filter for a solid-state imaging element capable of suppressing damage in an organic film layer when a photoresist is stripped off, and a method of manufacturing a color filter using the same.

The inventors of the present invention have conducted extensive studies to achieve the above-described objects and, as a result, have found that a thermosetting coloring composition for manufacturing a color filter for a solid-state imaging element containing a specific thermosetting compound (C) has sufficient stripping liquid resistance. Based on this finding, they made the present invention.

The present invention relates to a thermosetting coloring composition for manufacturing a color filter for a solid-state imaging element provided with a colored pattern formed by patterning a colored layer by dry etching. The composition contains a pigment (A), a dispersant (B), a thermosetting compound (C), and a solvent (D). A ratio of the pigment (A) to a total solid content of the thermosetting coloring composition is 50 mass percent or more. The dispersant (B) contains a dispersant (b1) having an acidic functional group and/or a dispersant (b2) having a basic functional group. The thermosetting compound (C) contains a glycidyl etherified epoxy compound of sorbitol.

The present invention relates to the thermosetting coloring composition, wherein the pigment (A) contains a green pigment (a1).

The present invention relates to the thermosetting coloring composition, wherein the green pigment (a1) contains at least one selected from the group consisting of Pigment Green 7, Pigment Green 36, and Pigment Green 58.

The present invention relates to the thermosetting coloring composition, wherein the solvent (D) contains a solvent (d1) having a boiling point of 160° C. or higher.

The present invention relates to the thermosetting coloring composition, wherein the solvent (d1) having a boiling point of 160° C. or higher is cyclohexanol acetate.

The present invention relates to the thermosetting coloring composition, wherein the dispersant (B) contains the dispersant (b1) having the acidic functional group, the dispersant (b1) having the acidic functional group has a segment (b1-A) obtained by polymerizing an ethylenic unsaturated monomer containing (meth)acrylate, and a theoretical value of a glass transition temperature of the segment (b1-A) is 40° C. or higher.

The present invention relates to the thermosetting coloring composition, wherein the acidic functional group is an aromatic carboxyl group.

The present invention relates to the thermosetting coloring composition, wherein the theoretical value of the glass transition temperature of the segment (b1-A) is 80° C. or higher.

The present invention relates to a method of manufacturing a color filter for a solid-state imaging element, the method comprising:

(X) forming a colored layer using the thermosetting coloring composition; and (Y) patterning the colored layer by dry etching.

The present invention relates to a method of manufacturing a color filter for a solid-state imaging element, wherein (X) includes (X-1) forming a coating film containing the thermosetting coloring composition, and (X-2) thermally curing the coating film to obtain the colored layer, and (Y) includes (Y-1) forming a photoresist layer on the colored layer, (Y-2) patterning the photoresist layer by performing exposure and development to obtain a resist pattern, (Y-3) patterning the colored layer by dry etching using the resist pattern as an etching mask to form a colored pattern, and (Y-4) bringing a stripping liquid into contact with the resist pattern to remove the resist pattern from the colored pattern.

The present invention relates to a method of manufacturing a color filter for a solid-state imaging element, wherein the stripping liquid contains at least one selected from the group consisting of N-methylpyrrolidone, dimethylsulfoxide, and monoethanolamine.

By using the thermosetting coloring composition for manufacturing a color filter for a solid-state imaging element of the present invention, it is possible to obtain an organic film having high resistance to a stripping liquid in a process of stripping a photoresist, and it is possible to manufacture a color filter for a solid-state imaging element by dry etching.

BRIEF DESCRIPTION OF THE DRAWING(S)

DETAILED DESCRIPTION

Figure 1:
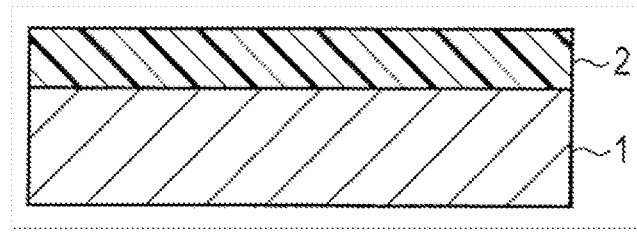
FIG. 1 shows one step of a forming method in which patterning is performed by dry etching.

Hereinafter, embodiments of the present invention will be described in detail.

In the present specification, the term "(meth)acryloyl", "(meth)acryl", "(meth)acrylic acid", "(meth)acrylate", or "(meth)acrylamide" represents, unless otherwise specified, "acryloyl and/or methacryloyl", "acryl and/or methacryl", "acrylic acid and/or methacrylic acid", "acrylate and/or methacrylate" or "acrylamide and/or methacrylamide", respectively.

"C.I." in the present specification refers to a color index (C.I.).

Moreover, in the present specification, the term "color filter for a solid-state imaging element" refers to a color filter used in a solid-state imaging element provided with a colored pattern obtained by patterning a colored layer by dry etching.

A thermosetting coloring composition for manufacturing a color filter for a solid-state imaging element of the present invention is a thermosetting coloring composition containing a pigment (A), a dispersant (B), a thermosetting compound (C), and a solvent (D), wherein a ratio of the pigment (A) to a total solid content of the color filter thermosetting coloring composition is 50 mass percent or more, the dispersant (B) contains a dispersant (b1) having an acidic functional group and/or a dispersant (b2) having a basic functional group, and the thermosetting compound (C) contains a glycidyl therified epoxy compound of sorbitol.

<Pigment (A)>

For the pigment (A) used in the present invention, a plurality of organic pigments such as a red pigment, a blue pigment, a green pigment, a yellow pigment, and a violet pigment can be used in combination.

Specific examples include diketopyrrolopyrrole-based pigments, azo-based pigments such as azo, disazo, and polyazo, anthraquinone-based pigments such as aminoanthraquinone, diaminodianthraquinone, anthrapyrimidine, flavanthrone, anthanthrone, indanthrone, pyranthrone, and violanthrone, quinacridone-based pigments, perinone-based pigments, perylene-based pigments, thioindigo-based pigments, isoindoline-based pigments, isoindolinone-based pigments, quinophthalone-based pigments, threne-based pigments, metal complex-based pigments, and the like.

The pigment (A) is, for example, an organic pigment. Specific examples of these organic pigments are as follows.

Examples of the red pigment include C.I. Pigment Red 1, 2, 3, 4, 5, 6, 7, 8, 9, 12, 14, 15, 16, 17, 21, 22, 23, 31, 32, 37, 38, 41, 47, 48, 48:1, 48:2, 48:3, 48:4, 49, 49:1, 49:2, 50:1, 52:1, 52:2, 53, 53:1, 53:2, 53:3, 57, 57:1, 57:2, 58:4, 60, 63, 63:1, 63:2, 64, 64:1, 68, 69, 81, 81:1, 81:2, 81:3, 81:4, 83, 88, 90:1, 101, 101:1, 104, 108, 108:1, 109, 112, 113, 114, 122, 123, 144, 146, 147, 149, 151, 166, 168, 169, 170, 172, 173, 174, 175, 176, 177, 178, 179, 181, 184, 185, 187, 188, 190, 193, 194, 200, 202, 206, 207, 208, 209, 210, 214, 216, 220, 221, 224, 230, 231, 232, 233, 235, 236, 237, 238, 239, 242, 243, 245, 247, 249, 250, 251, 253, 254, 255, 256, 257, 258, 259, 260, 262, 263, 264, 265, 266, 267, 268, 269, 270, 271, 272, 273, 274, 275, 276, and the like.

For an orange pigment which functions similarly to the red pigment, for example, C.I. Pigment Orange 36, 38, 43, 51, 55, 59, 61, and the like, can be used.

Among them, from the viewpoint of obtaining high coloring power, use of C.I. Pigment Red 254 and C.I. Pigment Red 177 as the red pigment is particularly preferable.

Examples of the blue pigment include C.I. Pigment Blue 1, 1:2, 9, 14, 15, 15:1, 15:2, 15:3, 15:4, 15:6, 16, 17, 19, 25, 27, 28, 29, 33, 35, 36, 56, 56:1, 60, 61, 61:1, 62, 63, 66, 67, 68, 71, 72, 73, 74, 75, 76, 78, 79, and the like. Among them, from the viewpoint of obtaining high coloring power, C.I. Pigment Blue 15, 15:1, 15:2, 15:3, 15:4, or 15:6 is preferable, and C.I. Pigment Blue 15:3 or C.I. Pigment Blue 15:6 is more preferable.

Examples of the green pigment include C.I. Pigment Green 1, 2, 4, 7, 8, 10, 13, 14, 15, 17, 18, 19, 26, 36, 45, 48, 50, 51, 54, 55 and 58. Among them, from the viewpoint of obtaining high coloring power, it is preferable to use at least one selected from the group consisting of C.I. Pigment Green 7, Pigment Green 36, and Pigment Green 58.

Examples of the yellow pigment include C.I. Pigment Yellow 1, 1:1, 2, 3, 4, 5, 6, 9, 10, 12, 13, 14, 16, 17, 24, 31, 32, 34, 35, 35:1, 36, 36:1, 37, 37:1, 40, 41, 42, 43, 48, 53, 55, 61, 62, 62:1, 63, 65, 73, 74, 75, 81, 83, 87, 93, 94, 95, 97, 100, 101, 104, 105, 108, 109, 110, 111, 116, 117, 119, 120, 126, 127, 127:1, 128, 129, 133, 134, 136, 138, 139, 142, 147, 148, 150, 151, 153, 154, 155, 157, 158, 159, 160, 161, 162, 163, 164, 165, 166, 167, 168, 169, 170, 172, 173, 174, 175, 176, 180, 181, 182, 183, 184, 185, 188, 189, 190, 191, 191:1, 192, 193, 194, 195, 196, 197, 198, 199, 200, 202, 203, 204, 205, 206, 207, 208, and the like. Among them, from the viewpoint of obtaining high coloring power, C.I. Pigment Yellow 83, 117, 129, 138, 139, 150, 154, 155, 180 or 185 is preferable, and C.I. Pigment Yellow 83, 138, 139, 150, or 185 is more preferable.

Examples of the violet pigment include C.I. Pigment Violet 1, 1:1, 2, 2:2, 3, 3:1, 3:3, 5, 5:1, 14, 15, 16, 19, 23, 25, 27, 29, 31, 32, 37, 39, 42, 44, 47, 49, 50, and the like. Among them, from the viewpoint of obtaining high coloring power, C.I. Pigment Violet 19 or 23 is preferable, and C.I. Pigment Violet 23 is more preferable.

In particular, as the organic pigment of the present invention, it is preferable to combine a blue pigment, a yellow pigment, and a violet pigment, and the preferable combination ratio with respect to the entire organic pigment (A) is 32 to 45% by weight of the blue pigment, 30 to 40% by weight of the yellow pigment, and 20 to 30% by weight of the violet pigment.

In the thermosetting coloring composition for manufacturing a color filter for a solid-state imaging element of the present invention, the concentration of the pigment (A) with respect to all non-volatile components is preferably 50% by weight or more from the viewpoint of obtaining sufficient color characteristics, and more preferably 60 to 85% by weight. When the concentration of the pigment (A) is less than 50% by weight, sufficient color characteristics may not be obtained in some cases, and when the concentration exceeds 90% by weight, the concentration of a colorant carrier such as a binder resin decreases, which may, in some cases, result in deterioration in stability of the coloring composition.

<Micronization of Pigment>

When the pigment is used in the present disclosure, it is preferable to use the micronized pigment. The micronization method is not particularly limited, and, for example, wet grinding, dry grinding, and dissolution-deposition methods are all available. In some embodiments, salt milling treatment by a kneader method, which is one type of wet grinding as exemplified in the present disclosure, can be carried out. The primary particle size of the pigment is preferably comprised in the range from 20 nm to 100 nm for excellence in dispersion in the colorant carrier and to achieve a high contrast ratio when forming the color filter. A particularly preferable range of the particle size of the pigment is of 25 to 85 nm. The primary particle size of the pigment was measured by directly measuring the size of the primary particles of the pigment from the electron micrograph by a transmission electron microscope (TEM). Specifically, the minor axis diameter and the major axis diameter of the primary particle of each pigment were measured, and the average was determined as a particle diameter of the pigment particle. Next, for 100 or more pigment particles, the volume of each particle was obtained in approximation to a cube of the particle diameter obtained, and the volume average particle diameter was determined as an average primary particle size.

Since the thermosetting coloring composition of the present invention contains a thermosetting compound (C) having an epoxy compound together with a dispersant (B) containing a thermally crosslinkable functional group, even when such micronized pigments are used, the thermosetting coloring composition for manufacturing a color filter is excellent in resistance and has a high luminance and contrast ratio.

The salt milling treatment is a treatment in which a mixture of a pigment, a water-soluble inorganic salt, and a water-soluble organic solvent is mechanically kneaded with heating using a kneading machine such as a kneader, a two-roll mill, a three-roll mill, a ball mill, an attritor, and a sand mill, followed by washing with water to remove the water-soluble inorganic salt and the water-soluble organic solvent. The water-soluble inorganic salt functions as a pulverization aid, and the pigments are pulverized using the high hardness of the inorganic salt at the time of salt milling. By optimizing the conditions when the salt milling treatment is applied to the pigment, it is possible to obtain a pigment having an extremely micronized primary particle size, a narrow distribution width, and a sharp particle size distribution.

As the water-soluble inorganic salt, it is possible to use sodium chloride, barium chloride, potassium chloride, sodium sulfate, and the like, but it is preferable to use sodium chloride (salt) in terms of costs. From the viewpoint of both processing efficiency and production efficiency, the water-soluble inorganic salt is preferably used in an amount of 50 to 2,000 parts by weight, and most preferably 300 to 1,000 parts by weight, based on 100 parts by weight of the pigment.

The water-soluble organic solvent functions to wet the pigment and the water-soluble inorganic salt, and is not particularly limited, as long as it is soluble (miscible) in water and does not essentially dissolve the inorganic salt to be used. However, since the temperature rises during salt milling and the solvent gets easily evaporated, from the viewpoint of safety, a solvent having a high boiling point of 120° C. or higher is preferable. Examples include 2-methoxyethanol, 2-butoxyethanol, 2-(isopentyloxy)ethanol, 2-(hexyloxy)ethanol, diethylene glycol, diethylene glycol monoethyl ether, diethylene glycol monobutyl ether, triethylene glycol, triethylene glycol monomethyl ether, polyethylene glycol in the liquid state, 1-methoxy-2-propanol, 1-ethoxy-2-propanol, dipropylene glycol, dipropylene glycol monomethyl ether, dipropylene glycol monoethyl ether, polypropylene glycol in the liquid state, and the like. The water-soluble organic solvent is preferably used in an amount of 5 to 1,000 parts by weight, and most preferably 50 to 500 parts by weight, based on 100 parts by weight of the pigment.

When the pigment is subjected to a salt-milling treatment, a resin may be added as needed. The types of the resin to be used are not particularly limited, and natural resins, modified natural resins, synthetic resins, synthetic resins modified with natural resins, and the like, can be used. The resin to be used is preferably solid at room temperature and insoluble in water, and more preferably soluble partially in organic solvents. The amount of the resin to be used is preferably in the range of 5 to 200 parts by weight based on 100 parts by weight of the pigment.

<Dispersant (B)>

The thermosetting coloring composition for manufacturing a color filter of the present invention further comprises a dispersant (B). The dispersant (B) includes a dispersant (b1) having an acidic functional group and/or a dispersant (b2) having a basic functional group. With the dispersant (B), the dispersion stability of the thermosetting coloring composition of the present invention is further improved, and it is possible to obtain a thermosetting coloring composition excellent in viscosity stability. In addition, since the uniformity of the coating film is improved when the pigment (A) is well dispersed in the organic film layer, the resistance to the stripping liquid increases, which allows application to the manufacturing method of the color filter by dry etching.

The dispersant (B) includes a colorant affinity segment having a property of adsorbing to the pigment (A), and a segment having soluble compatibility with a colorant carrier. The dispersant (B) adsorbs to the pigment (A) and functions to stabilize dispersion in the colorant carrier. Examples of the dispersant (B) include polyurethanes, polycarboxylic acid esters such as polyacrylates, unsaturated polyamides, polycarboxylic acids, (partial) amine salts of polycarboxylic acids, ammonium salts of polycarboxylic acids, alkyl amine salts of polycarboxylic acids, polysiloxanes, long-chain polyaminoamide phosphates, hydroxyl group-containing polycarboxylic acid esters, and modified products of these compounds, oil-based dispersants such as amides formed by a reaction between a poly(lower alkyleneimine) and a polyester having free carboxyl groups, and salts thereof, (meth)acrylic acid-styrene copolymers, (meth)acrylic acid-(meth) acrylate ester copolymers, styrene-maleic acid copolymers, water-soluble resins and water-soluble polymer compounds such as polyvinyl alcohol and polyvinylpyrrolidone, and polyester, modified polyacrylate, ethylene oxide/propylene oxide adducts, and phosphate ester. These resin-type dispersants may be used individually, or in mixtures containing two or more dispersants, but they are not necessarily limited thereto.

Among the above dispersants, it is preferable to contain both the dispersant (b1) having an acidic functional group and the dispersant (b2) having a basic functional group, because they enable the dispersion to be lowered in viscosity and also to be excellent in viscosity stability with a small addition amount.

Of the dispersant (b1) having an acidic functional group and the dispersant (b2) having a basic functional group, the dispersant (B) may contain only the dispersant (b1) having an acidic functional group, or may contain only the dispersant (b2) having a basic functional group. The dispersant (B) may consist only of the dispersant (b1) having an acidic functional group, or may consist only of the dispersant (b2) having a basic functional group.

The total proportion of the dispersant (b1) having an acidic functional group and the dispersant (b2) having a basic functional group in the dispersant (B) is, for example, in the range of 80 mass percent to 100 mass percent, and preferably in the range of 90 mass percent to 100 mass percent.

According to an example, the proportion of the dispersant (b1) having an acidic functional group in the total amount of the dispersant (b1) having an acidic functional group and the dispersant (b2) having a basic functional group is preferably 30 mass percent or more, and preferably 50 mass percent or more. According to another example, the proportion is in the range of 20 mass percent to 80 mass percent, and preferably in the range of 30 mass percent to 70 mass percent.

Preferable examples of the dispersant (b2) having a basic functional group include a nitrogen atom-containing graft copolymer, a nitrogen atom-containing acrylic block copolymer having functional groups including a tertiary amino group, a quaternary ammonium base, a nitrogen-containing heterocycle, etc. in a side chain, and a urethane-based polymer dispersant.

Preferable examples of the dispersant (b1) having an acidic functional group include an acrylic ester copolymer, an acrylic block copolymer, and a urethane-based polymer dispersant having functional groups including a carboxylic acid group, a phosphoric acid group, a sulfonic acid group, and the like. The dispersant (b1) having an acidic functional group preferably has a segment (b1-A) obtained by polymerizing an ethylenic unsaturated monomer containing (meth) acrylate in which the theoretical value of the glass transition temperature of the segment (b1-A) is 40° C. or higher to improve the resistance to the stripping liquid, and particularly preferably 80° C. or higher. A further preferable polymeric dispersant having an acidic functional group is a dispersant (b11) having an aromatic carboxyl group. Using the dispersant (b11) having an aromatic carboxyl group as the dispersant (b1) having an acidic functional group is preferred because the resistance to the stripping liquid increases.

The dispersant (b11) having an aromatic carboxyl group is one having an aromatic carboxyl group in its molecule. The production method thereof may be any of, for example, Production Method 1 in which an aromatic tricarboxylic acid anhydride (F1) and/or an aromatic tetracarboxylic dianhydride (F2) are/is reacted with a polymer (E) having a hydroxyl group, Production Method 2 in which a monomer having an aromatic carboxylic group is used to prepare a polymer, and Production Method 3 in which an aromatic tricarboxylic anhydride (F1) and/or an aromatic tetracarboxylic dianhydride (F2) are/is reacted while polymerizing a monomer having an hydroxyl group. Among these, from the viewpoint of pigment dispersibility, preferable are those prepared by Production Method 1 in which the number of aromatic carboxyl groups in the dispersant (B) is more easily controlled.

That is, in terms of excellent stability, the dispersant (b11) having an aromatic carboxyl group is preferably a dispersant obtained by reacting a polymer (E) having a hydroxyl group with an aromatic tricarboxylic acid anhydride (F1) and/or an aromatic tetracarboxylic dianhydride (F2), more preferably a dispersant in which a polymer (E) having a hydroxyl group is a polymer having a hydroxyl group at one end, and still more preferably a dispersant in which a polymer (E) having a hydroxyl group at one end is a polymer having two hydroxyl groups at one end.

The polymer (E) having a hydroxyl group at one end is preferably a polyester and/or polyether-based polymer having a hydroxyl group at one end, or a vinyl-based polymer having a hydroxyl group at one end, and particularly preferably a vinyl-based polymer having a hydroxyl group at one end in terms of dispersion stability.

As the aromatic tricarboxylic anhydride (F1) and/or the aromatic tetracarboxylic dianhydride (F2), aromatic tetracarboxylic dianhydride (F2) is particularly preferable in terms of excellent storage stability of the pigment dispersion.

Examples of how to obtain the dispersant (b11) having an aromatic carboxyl group as described above include a method in which a reaction is made between the hydroxyl group in a polyol (e1) and the acid anhydride group in a polycarboxylic acid anhydride (f) containing at least the aromatic tetracarboxylic dianhydride (F2) in the presence of a compound (e11) having two hydroxyl groups and one thiol group in the molecule. The polyol (e1) contains at least a vinyl polymer (e12) having two hydroxyl groups at one end, and is obtained by radical polymerization of the ethylenic unsaturated monomer.

For the dispersant (b11) having an aromatic carboxyl group as described above, it is preferable to contain methyl methacrylate as a constituent monomer of the vinyl polymer (e12) segment because it has an effect of increasing the resistance to the stripping liquid. More preferably, the content of methyl methacrylate in the polymer in a weight ratio is 30% or more, more preferably 50% or more, and still more preferably 65% or more. If it is less than 30%, the resistance to the stripping liquid may be lowered.

For the dispersant (b11) having an aromatic carboxyl group, the publicly-known techniques can be used as described in International Publication No. 2008/007776, Jpn. Pat. Appln. KOKAI Publication No. 2009-185277, and Jpn. Pat. Appln. KOKAI Publication No. 2008-029901.

Commercially available examples of the dispersant (b1) having an acidic functional group include Disperbyk-101, 110, 111, 130, 140, 170, 171, 174, 180, 2001, 2020, 2025, 2070 or BYK-P104, P104S, 220S, etc. manufactured by BYK Japan KK, SOLSPERSE-3000, 13240, 13650, 13940, 16000, 17000, 18000, 21000, 24000, 26000, 27000, 28000, 31845, 32000, 32500, 32550, 32600, 34750, 35100, 36600, 38500, 41000, 41090, 53095, 55000, etc. manufactured by The Lubrizol Corporation, EFKA-4008, 4009, 4010, 4406, 5010, 5065, 5066, 5070, etc. manufactured by Ciba Japan, and AJISPER PA111, PB821, PB822, etc. manufactured by Ajinomoto Fine-Techno Co., Ltd.

Commercially available examples of the dispersant (b2) having a basic functional group include Disperbyk-101, 108, 116, 130, 140, 161, 162, 163, 164, 165, 166, 180, 182, 183, 184, 185, 2000, 2001, 2020, 2025, 2050, 2070, 2150, or BYK-6919, etc. manufactured by BYK Japan KK, SOL-SPERSE-13240, 13650, 13940, 20000, 24000, 26000, 31845, 32000, 32500, 32550, 34750, 35100, etc. manufactured by The Lubrizol Corporation, EFKA-4008, 4009, 4010, 4015, 4020, 4047, 4050, 4055, 4060, 4080, 4400, 4401, 4402, 4403, 4406, 4300, 4330, 4500, 4510, 4530, 4550, 4560, 4800, etc. manufactured by Ciba Japan, and AJISPER PB711, PB821, PB822, etc. manufactured by Ajinomoto Fine-Techno Co., Ltd.

The dispersant (B) is used preferably in an amount of about 5 to 2000 by weight based on the total amount of the pigment (A), and more preferably about 10 to 40% by weight from the viewpoint of film formability.

<Thermosetting Compound (C)>

The thermosetting coloring composition for manufacturing a color filter of the present invention contains a glycidyl etherified epoxy compound of sorbitol as a thermosetting compound. Containing the glycidyl etherified epoxy compound of sorbitol provides effects that the cross-linking of a coating film advances during baking the organic film layer using the thermosetting coloring composition of the present invention and that the resistance to the stripping liquid increases, and the thermosetting coloring composition can be applied to the manufacturing method of a color filter by dry etching.

Examples of the glycidyl etherified epoxy compound of sorbitol include Denacol EX-611, EX-612, EX-614, EX-614B, EX-622, etc. which are commercially available from Nagase ChemteX Corporation.

The thermosetting coloring composition for manufacturing a color filter of the present invention may be further used in combination with other thermosetting compounds. The proportion of the glycidyl esterified epoxy compound of sorbitol in the total solid content of the thermosetting compound (C) is, for example, in the range of 1 mass percent to 20 mass percent, and preferably in the range of 5 mass percent to 10 mass percent. The thermosetting compound (C) may be composed of a glycidyl etherified epoxy compound of sorbitol.

Examples of other thermosetting compounds that can be used in combination with the glycidyl etherified epoxy compound of sorbitol include epoxy compounds other than the glycidyl etherified epoxy compound of sorbitol, benzoguanamine compounds, rosin modified maleic acid compounds, rosin modified fumaric acid compounds, melamine compounds, urea compounds, cardo compounds, and phenol compounds, but the present invention is not limited thereto. Among them, epoxy compounds other than the glycidyl etherified epoxy compound of sorbitol are preferred. The cross-linking of the coating film advances during baking the organic film layer using the coloring composition of the present invention and the resistance to the stripping liquid increases, which are the effects provided.

Examples of commercially-available epoxy compounds other than the glycidyl etherified epoxy compound of sorbitol include Epikote 807, Epikote 815, Epikote 825, Epikote 827, Epikote 828, Epikote 190P, Epikote 191P, Epikote 1004, Epikote 1256 (trade names; manufactured by Mitsubishi Chemical Corporation), TECHMORE VG3101L (trade name; manufactured by Mitsui Chemicals, Inc.), EPPN-501H, 502H (trade names; manufactured by Nippon Kayaku Co., Ltd.), JER 1032H60, JER 157S65, 157S70 (trade names; manufactured by Mitsubishi Chemical Corporation), EPPN-201 (trade name; manufactured by Nippon Kayaku Co., Ltd.), JER 152, JER 154 (trade names; manufactured by Mitsubishi Chemical Corporation), EOCN-102S, EOCN-103S, EOCN-104S, EOCN-1020 (trade names; manufactured by Nippon Kayaku Co., Ltd.), CELLOXIDE 2021, EHPE-3150 (trade names; manufactured by Daicel Corporation), Denacol EX-810, EX-830, EX-851, EX-611, EX-512, EX-421, EX-313, EX-201, EX-111 (trade names; manufactured by Nagase ChemteX Corporation), etc., but are not limited thereto.

In the thermosetting coloring composition for manufacturing a color filter for a solid-state imaging element of the present invention, the concentration of the thermosetting compound (C) with respect to all non-volatile components is preferably 1 to 30% by weight or more from the viewpoint of obtaining sufficient thermosetting properties, and more preferably 3 to 20% by weight. When the concentration of the thermosetting compound (C) is less than 1% by weight, sufficient crosslinking at the time of baking may not be obtained, and when it exceeds 30% by weight, the concentration of the pigment (A) becomes lower and sufficient color characteristics may not be obtained in some cases.

<<Solvent (D)>>

The thermosetting coloring composition for manufacturing a color filter of the present invention is used to easily form a filter segment by sufficiently dispersing a pigment (A) in a colorant carrier such as a binder resin and a polyfunctional monomer and applying the thermosetting coloring composition on a substrate, such as a silicon wafer substrate, to have a dry coating film thickness of 0.2 to 10 μm. Examples of the solvent (D) include 1,2,3-trichloropropane, 1,3-butanediol, 1,3-butylene glycol, 1,3-butylene glycol diacetate, 1,4-dioxane, 2-heptanone, 2-methyl-1,3-propanediol, 3,5,5-trimethyl-2-cyclohexene-1-one, 3,3,5-trimethylcyclohexanone, ethyl 3-ethoxypropionate, 3-methyl-1,3-butanediol, 3-methoxy-3-methyl-1-butanol, 3-methoxy-3-methylbutyl acetate, 3-methoxybutanol, 3-methoxybutyl acetate, 4-heptanone, m-xylene, m-diethylbenzene, m-dichlorobenzene, N,N-dimethylacetamide, N,N-dimethylformamide, n-butyl alcohol, n-butyl benzene, n-propyl acetate, N-methylpyrrolidone, o-xylene, o-chlorotoluene, o-diethylbenzene, o-dichlorobenzene, p-chlorotoluene, p-diethylbenzene, sec-butylbenzene, tert-butylbenzene, γ-butyrolactone, isobutyl alcohol, isophorone, ethylene glycol diethyl ether, ethylene glycol dibutyl ether, ethylene glycol monoisopropyl ether, ethylene glycol monoethyl ether, ethylene glycol monoethyl ether acetate, ethylene glycol mono tertiary butyl ether, ethylene glycol monobutyl ether, ethylene glycol monobutyl ether acetate, ethylene glycol monopropyl ether, ethylene glycol monohexyl ether, ethylene glycol monomethyl ether, ethylene glycol monomethyl ether acetate, diisobutyl ketone, diethylene glycol diethyl ether, diethylene glycol dimethyl ether, diethylene glycol monoisopropyl ether, diethylene glycol monoethyl ether acetate, diethylene glycol monobutyl ether, diethylene glycol monobutyl ether acetate, diethylene glycol monomethyl ether, cyclohexanol, cyclohexanol acetate, cyclohexanone, dipropylene glycol dimethyl ether, dipropylene glycol methyl ether acetate, dipropylene glycol monoethyl ether, dipropylene glycol monobutyl ether, dipropylene glycol monopropyl ether, dipropylene glycol monomethyl ether, diacetone alcohol, triacetin, tripropylene glycol monobutyl ether, tripropylene glycol monomethyl ether, propylene glycol diacetate, propylene glycol phenyl ether, propylene glycol monoethyl ether, propylene glycol monoethyl ether acetate, propylene glycol monobutyl ether, propylene glycol monopropyl ether, propylene glycol monomethyl ether, propylene glycol monomethyl ether acetate, propylene glycol monomethyl ether propionate, benzyl alcohol, methyl isobutyl ketone, methyl cyclohexanol, n-amyl acetate, n-butyl acetate, isoamyl acetate, isobutyl acetate, propyl acetate, dibasic acid ester, etc.

These solvents can be used singly or as a mixture of two or more in a given ratio as necessary.

It is preferable to include a solvent (d1) having a boiling point of 160° C. or higher from the viewpoint of suppressing aggregated foreign substances on a substrate such as a silicon wafer substrate. It is particularly preferable to include cyclohexanol acetate (boiling point 177° C.) or ethyl 3-ethoxypropionate (boiling point 165° C.) from the viewpoint of suppressing aggregated foreign substances on a substrate such as a silicon wafer substrate.

The solvent (D) can be used in an amount of 100 to 10,000 parts by weight, preferably 500 to 5,000 parts by weight, based on 100 parts by weight of the colorant in the coloring composition.

<<Leveling Agent>>

In the thermosetting coloring composition of the present disclosure, it is preferable to add a leveling agent in order to improve the leveling property of the composition on the transparent substrate. As the leveling agent, dimethylsiloxane having a polyether structure or polyester structure in the main chain is preferable. Specific examples of dimethylsiloxane having a polyether structure in the main chain include FZ-2122 manufactured by Dow Corning Toray Co., Ltd., BYK-333 manufactured by BYK, and the like. Specific examples of dimethylsiloxane having a polyester structure in the main chain include BYK-310, BYK-370 manufactured by BYK, and the like. Dimethylsiloxane having a polyether structure in the main chain and dimethylsiloxane having a polyester structure in the main chain can be used in combination. In general, the content of the leveling agent is preferably 0.003 to 1.0 parts by weight based on 100 parts by weight of the total weight of the coloring composition.

A particularly preferable leveling agent is a type of a so-called surfactant having a hydrophobic group and a hydrophilic group in the molecule, and characterized in that its solubility in water is low despite having a hydrophilic group, and, when it is added to the thermosetting coloring composition, the surface tension-reducing ability is low. A leveling agent having excellent wettability with respect to the glass plate despite the low surface tension-reducing ability is useful, and one capable of sufficiently preventing electrification at an additive amount at which a defect of the coating film due to foaming does not appear is preferably used. As the leveling agent having such preferable characteristics, dimethylpolysiloxane having a polyalkylene oxide unit can be preferably used. As the polyalkylene oxide unit, there are a polyethylene oxide unit and a polypropylene oxide unit, and dimethylpolysiloxane may have both a polyethylene oxide unit and a polypropylene oxide unit.

In addition, the mode of bonding with dimethylpolysiloxane of the polyalkylene oxide unit may be any of a pendant type in which a polyalkylene oxide unit is bonded in a repeating unit of dimethylpolysiloxane, a terminal-modified type in which it is bonded to the terminal of dimethylpolysiloxane, and a linear block copolymer type in which it is alternately and repeatedly bonded to dimethylpolysiloxane. Dimethylpolysiloxane having a polyalkylene oxide unit is commercially available from Toray Dow Corning Co., Ltd., examples of which include FZ-2110, FZ-2122, FZ-2130, FZ-2166, FZ-2191, FZ-2203, and FZ-2207, but it is not limited thereto.

To the leveling agent, an anionic, cationic, nonionic, or amphoteric surfactant can be supplementarily added. Two or more surfactants may be used in combination.

Examples of the anionic surfactant supplementarily added to the leveling agent include polyoxyethylene alkyl ether sulfates, sodium dodecylbenzene sulfonate, alkali salts of styrene-acrylic acid copolymer, sodium alkyl naphthalene sulfonate, sodium alkyl diphenyl ether disulfonate, lauryl sulfate monoethanolamine, lauryl sulfate triethanolamine, lauryl sulfate ammonium, stearic acid monoethanolamine, sodium stearate, sodium lauryl sulfate, monoethanolamine of styrene-acrylic acid copolymer, polyoxyethylene alkyl ether phosphate ester, and the like.

Examples of the cationic surfactant supplementarily added to the leveling agent include alkyl quaternary ammonium salts and ethylene oxide adducts thereof. Examples of the nonionic surfactant supplementarily added to the leveling agent include polyoxyethylene oleyl ether, polyoxyethylene lauryl ether, polyoxyethylene nonyl phenyl ether, polyoxyethylene alkyl ether phosphate ester, polyoxyethylene sorbitan monostearate, polyethylene glycol monolaurate, and the like. Examples of amphoteric surfactants include alkylbetaines such as alkyldimethylaminoacetic acid betaine, alkylimidazoline, and the like. Furthermore, fluorine-based or silicone-based surfactants may be used.

<<Method for Producing a Thermosetting Coloring Composition for Manufacturing a Color Filter>>

The thermosetting coloring composition for manufacturing a color filter of the present disclosure can be prepared by finely dispersing a pigment (A) in a colorant carrier such as a resin and/or a solvent together with a dispersing aid as needed using various dispersing means such as a kneader, a two-roll mill, a three-roll mill, a ball mill, a horizontal sand mill, a vertical sand mill, an annular bead mill, and an attritor. At this time, two or more types of colorants or the like may be dispersed in the colorant carrier simultaneously, or those dispersed separately in the colorant carrier may be mixed.

When the solubility of the pigment (A) is high such as a dye, specifically if the solubility in the solvent (D) to be used is high and dissolution is made by stirring with no foreign substance confirmed, it is unnecessary to produce the dispersion through fine dispersion as described above.

(Dispersing Aid)

When the pigment (A) is dispersed in the colorant carrier, dispersing aids such as a pigment derivative, a surfactant, and the like may be appropriately included. Since the dispersing aid has a large effect of preventing reagglomeration of the colorant after dispersion, the thermosetting coloring composition obtained by dispersing the pigment (A) in the colorant carrier using the dispersing aid has excellent spectral characteristics and viscosity stability.

Examples of the pigment derivative include a compound in which a basic substituent, an acidic substituent, or a phthalimidomethyl group which may have a substituent is introduced into an organic pigment, anthraquinone, acridone or triazine. Those described in Jpn. Pat. Appln. KOKAI Publication No. S63-305173, Jpn. Pat. Appln. KOKOKU Publication No. S57-15620, Jpn. Pat. Appln. KOKOKU Publication No. S59-40172, Jpn. Pat. Appln. KOKOKU Publication No. S63-17102 and Jpn. Pat. Appln. KOKOKU Publication No. H5-9469 can be used. They may be used alone or in a combination of two or more.

The blending amount of the pigment derivative is, from the viewpoint of improving the dispersibility of the additive colorant, preferably 0.5 parts by weight or more, more preferably 1 part by weight or more, and most preferably 3 parts by weight or more, based on 100 parts by weight of the pigment (A). From the viewpoint of heat resistance and light resistance, it is preferably 40 parts by weight or less, and more preferably 35 parts by weight or less, based on 100 parts by weight of the pigment (A).

Examples of the surfactant include anionic surfactants such as sodium lauryl sulfate, polyoxyethylene alkyl ether sulfate, sodium dodecylbenzene sulfonate, alkali salts of styrene-acrylic acid copolymer, sodium stearate, sodium alkylnaphthalene sulfonate, sodium alkyl diphenyl ether disulfonate, monoethanolamine lauryl sulfate, triethanolamine lauryl sulfate, ammonium lauryl sulfate, monoethanolamine stearate, monoethanol amine of styrene-acrylic acid copolymer, polyoxyethylene alkyl ether phosphate ester, and the like; nonionic surfactants such as polyoxyethylene oleyl ether, polyoxyethylene lauryl ether, polyoxyethylene nonylphenyl ether, polyoxyethylene alkyl ether phosphate ester, polyoxyethylene sorbitan monostearate, polyethylene glycol monolaurate, and the like; cationic surfactants such as alkyl quaternary ammonium salts and ethylene oxide adducts thereof; and amphoteric surfactants such as alkylbetaines such as alkyldimethylaminoacetic acid betaine, alkylimidazoline, and the like. These may be used alone or in a mixture of two or more, but are not necessarily limited thereto.

When a surfactant is added, the amount is preferably 0.1 to 55 parts by weight, and is more preferably 0.1 to 45 parts by weight, based on 100 parts by weight of the pigment (A). When the blending amount of the resin-type dispersing agent or the surfactant is less than 0.1 part by weight, it is difficult to obtain the effect provided by addition, and if the blending amount is more than 55 parts by weight, excessive dispersing agents may adversely affect the dispersion.

The forming method used in the present invention in which patterning is carried out by dry etching is a method in which patterning is carried out by forming a resin pattern in the form of a target on a target forming layer as a colored layer, performing dry etching using this resin pattern, that is, a resist pattern as a mask, and transferring the shape of the target to the target forming layer. Specifically, as illustrated in FIGS. 1 to 5, a thermosetting coloring composition for manufacturing a color filter is applied to form a color filter layer 2 (colored layer 2) on a substrate 1 (FIG. 1). A photosensitive resin layer 3 (photoresist layer 3, FIG. 2) is patterned thereon to form a resin pattern 4 (resist pattern 4, FIG. 3). The resist pattern 4 is in the form of a target and made of a photosensitive resin. The shape of the resist pattern 4 is transferred to the color filter layer 2 (as shown in FIG. 4) using the resist pattern 4 as a mask to thereby form a color filter pattern 5 (colored pattern 5, FIG. 5) of the target.

A method of manufacturing a color filter for a solid-state imaging element according to an embodiment will be described in more detail.

First, as illustrated in FIG. 1, a coating film (not shown) containing the thermosetting coloring composition according to an embodiment is formed on a substrate 1. Next, the coating film is thermally cured to form the colored layer 2.

Figure 2:
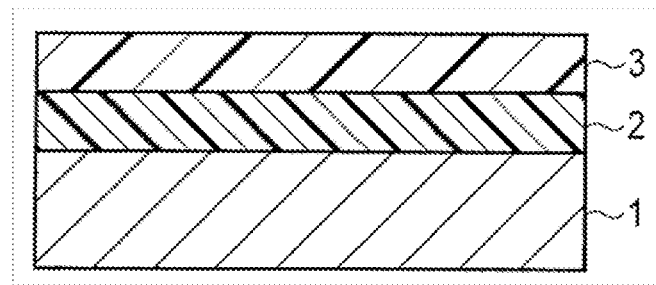
FIG. 2 shows one step of a forming method in which patterning is performed by dry etching.
Figure 3:
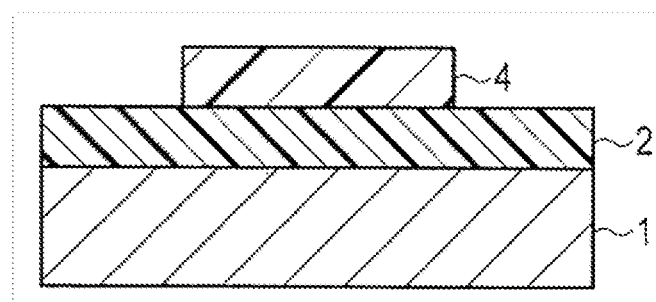
FIG. 3 shows one step of a forming method in which patterning is performed by dry etching.
Figure 4:
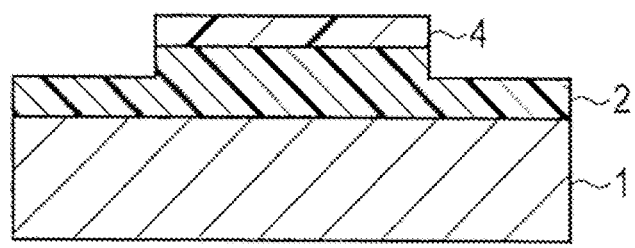
FIG. 4 shows one step of a forming method in which patterning is performed by dry etching.

Subsequently, as illustrated in FIGS. 2 and 3, after the photoresist layer 3 is formed on the colored layer 2, the photoresist layer 3 is subjected to exposure and development to pattern the photoresist layer 3 to thereby form the resist pattern 4.

Figure 5:
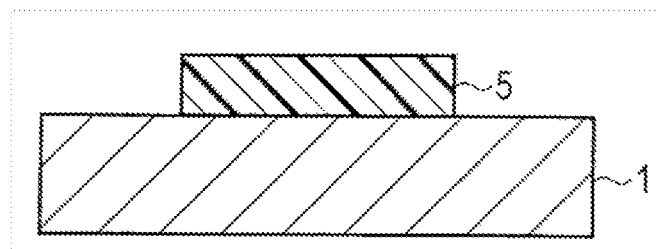
FIG. 5 shows one step of a forming method in which patterning is performed by dry etching

Furthermore, as illustrated in FIGS. 4 and 5, after the colored pattern 5 is formed by patterning the colored layer 2 by dry etching using the resist pattern 4 as an etching mask, a stripping liquid is brought into contact with the resist pattern 4 to remove the resist pattern 4 from the colored pattern 5.

By the method explained above, a color filter for a solid-state imaging element can be manufactured.

For a plasma source used for dry etching, Capacitively Coupled Plasma (CCP), Electron Cyclotron Resonance (ECR) Plasma, Helicon Wave Plasma (HWP), Inductively Coupled Plasma (ICP), Surface Wave Plasma (SWP), and like can be used, but ICP, which is excellent in plasma stability and suitable for micronizing processing, is particularly preferable.

The gas used for dry etching can be any gas having reactivity (oxidizing/reducing property), that is, having an etching property, examples of which include a gas having a halogen element such as fluorine, chlorine, bromine and the like in its composition, and a gas having oxygen or sulfur element in its composition. When etching is carried out by ion bombardment, a Group 18 element (rare gas) such as helium and argon can be used. Furthermore, when the reactive gas and the rare gas are mixed, a material to be etched may be etched to have a rectangular shape by the ion assisted reaction, and therefore it is particularly preferable to perform etching with a mixed gas of a reactive gas and a rare gas.

As the stripping liquid, an organic solvent and an inorganic solvent may be used, and one with high stripping property and no damage to the thermosetting coloring composition is selected. For example, stripping liquids containing at least one selected from the group consisting of N-methylpyrrolidone, dimethylsulfoxide and monoethanolamine are preferred.

EXAMPLES

Hereinafter, the present invention will be described based on examples, but the present invention is not limited by the examples. In the examples, "parts" and "%" represent "parts by weight" and "% by weight", respectively. "PGMAC" denotes methoxypropyl acetate.

The weight average molecular weight (Mw) of the resin is measured in the following manner.

(Weight Average Molecular Weight (Mw) of Resin)

The weight average molecular weight (Mw) of the resin is the polystyrene-equivalent weight average molecular weight measured with a GPC (HLC-8120 GPC, manufactured by Tosoh Corporation) equipped with an RI detector, using a TSKgel column (manufactured by Tosoh Corporation) and using THF as a developing solvent.

Next, a description will be given of a method for producing a binder resin solution, a method for producing a micronized pigment, and a method for producing a pigment dispersion, used in the examples and the comparative examples.

<Method for Producing Binder Resin Solution>

(Preparation of Acrylic Resin Solution 1)

196 parts of cyclohexanone was added to a reaction vessel having a separable 4-neck flask equipped with a thermometer, a cooling tube, a nitrogen gas inlet tube, a dropping tube and a stirrer, and heated to 80° C. After nitrogen substitution inside the reaction vessel, a mixture of 24.0 parts of benzyl methacrylate, 20.2 parts of n-butyl methacrylate, 14.9 parts of 2-hydroxyethyl methacrylate, 24.7 parts of p-cumylphenol ethylene oxide-modified acrylate ("Aronix M110" manufactured by Toagosei Co., Ltd.), and 1.1 parts of 2,2'-azobisisobutyronitrile was added dropwise over 2 hours from the dripping tube. After the completion of dripping, the reaction was further continued for 3 hours to obtain a solution of an acrylic resin.

After cooling to room temperature, about 2 parts of the resin solution was sampled, and then heated and dried at 180° C. for 20 minutes to measure the nonvolatile content. PGMAC was added to the previously synthesized resin solution to have a nonvolatile content of 20% by weight to thereby prepare an acrylic resin solution 1. The weight average molecular weight (Mw) was 26,000.

Production of Dispersant (b1) Having Acidic Functional Group (Production Example 1 of Dispersant (b1-1) Having Acidic Functional Group)

45.0 parts of methyl methacrylate, 15.0 parts of methacrylic acid, and 40.0 parts of ethyl acrylate were added to a reaction vessel equipped with a gas inlet tube, a thermometer, a condenser and a stirrer, and the interior was replaced with nitrogen gas. The interior of the reaction vessel was heated to 80° C. to which the solution obtained by dissolving 6.0 parts of 3-mercapto-1,2-propanediol and 0.1 part of 2,2'-azobisisobutyronitrile in 45.3 parts of cyclohexanone was added. The mixture was reacted for 10 hours. A solid content was measured to confirm that the reaction was performed to 95%. At this time, the weight average molecular weight was 4,000. Next, 8.8 parts of RIKACID BT-100 (manufactured by New Japan Chemical Co., Ltd.), 69.2 parts of cyclohexanone, and 0.2 parts of 1,8-diazabicyclo-[5.4.0]-7-undecene as a catalyst were added, and the mixture was reacted at 120° C. for 7 hours. An acid value was measured to confirm that the 98% or more of the acid anhydride was half esterified, and the reaction was terminated. After the completion of the reaction, methoxypropyl acetate was added to have a nonvolatile content of 50% by weight to thereby obtain a solution of the dispersant (b1-1) having an acidic functional group.

The raw materials used in the examples are listed below.
[Ethylenic Unsaturated Monomers]
 MAA: Methacrylic acid
 MMA: Methyl methacrylate
 EA: Ethyl acrylate
 t-BMA: Pert-butyl methacrylate
[Compound Having Two Hydroxyl Groups and One Thiol Group in Molecule]
 Thioglycerol: 3-mercapto-1,2-propanediol
[Radical Polymerization Initiator]
 AIBN: 2,2'-azobisisobutyronitrile
[Organic Solvent]
 Methoxypropyl acetate
[Tetracarboxylic Dianhydride]
 RIKACID BT-100: 1,2,3,4-butanetetracarboxylic dianhydride (manufactured by New Japan Chemical Co., Ltd.)
 PMA: Pyromellitic dianhydride (manufactured by Daicel Chemical Industries, Ltd.)
 BPDA: 3,3',4,4'-biphenyltetracarboxylic acid dianhydride (manufactured by Mitsubishi Chemical Corporation)
[Esterification Reaction Catalyst]
 DBU: 1,8-diazabicyclo-[5.4.0]-7-undecene (manufactured by San-Apro Ltd.)

(Production Examples 2 to 5 of Dispersants (b11-1 to b11-5) Having Aromatic Carboxyl Groups)

Synthesis was carried out in the same manner as in Production Example 1, except that the raw materials and the added amounts shown in Table 1 were used to obtain a methoxypropyl acetate solution of dispersants (b11-1 to b11-5) having acidic functional groups. Table 1 shows the theoretical values of the glass transition temperature (Tg) of the segment (b1-A) obtained by polymerizing an ethylenic unsaturated monomer containing (meth)acrylate of b1-1 and b11-1 to b11-5.

In the present invention, the theoretical value of the glass transition temperature indicates a value calculated from the Tg of each homopolymer to be copolymerized by the following Fox equation.

$$1/Tg = W1/Tg1 + W2/Tg2 + \ldots + Wn/Tgn \qquad \text{Fox's equation}$$

where W1 to Wn represent a weight fraction of the monomer used, and Tg1 to Tgn represent a glass transition temperature (unit: absolute temperature "K") of the homopolymer of the monomer.

For the Tg of the main homopolymer used for the calculation, the numerical values described in J. Brandup and E. H. Immergut, *Polymer Handbook*, $4^{th}$ Ed., WILEY INTERSCIENCE, 1999, can be used. The numerical values are exemplified below.
Ethyl acrylate: −22° C. (251 K)
t-butyl methacrylate: 107° C. (380 K)
Methacrylic acid: 130° C. (403 K)
Methyl methacrylate: 105° C. (378 K)

TABLE 1

| | DISPERSANT (b1) HAVING ACIDIC FUNCTIONAL GROUP | b1-1 | b11-1 | b11-2 | b11-3 | b11-4 | b11-5 |
|---|---|---|---|---|---|---|---|
| FIRST STAGE | MAA | 5 | 5 | 5 | 0 | 0 | 0 |
| (part by weight) | MMA | 55 | 55 | 55 | 70 | 70 | 55 |
| (b1-A) SEGMENT | EA | 40 | 40 | 40 | 30 | 10 | 45 |
| | t-BMA | | | | | 20 | |
| | THIOGLYCEROL | 6 | 6 | 6 | 6 | 6 | 6 |
| | AIBN | 0.1 | 0.1 | 0.1 | 0.1 | 0.1 | 0.1 |
| | METHOXYPROPYL ACETATE | 45.3 | 45.3 | 45.3 | 45.3 | 45.3 | 45.3 |
| | GLASS TRANSITION TEMPERATURE OF (b1-A) SITE | 42° C. | 42° C. | 42° C. | 55° C. | 87° C. | 35° C. |
| SECOND STAGE | PMA | | 9.69 | | 9.69 | 9.69 | 9.69 |
| (part by weight) | BPDA | | | 13.07 | | | |
| | RIKACID BT-100 | 8.80 | | | | | |
| | DBU | 0.2 | 0.2 | 0.2 | 0.2 | 0.2 | 0.2 |
| | METHOXYPROPYL ACETATE | 69.2 | 70.1 | 73.5 | 70.1 | 70.1 | 70.1 |

(Yellow Micronized Pigment (Y1))

100 parts of isoindolinone yellow pigment (C.I. Pigment Yellow 139 (PY139, "PALIOTOL YELLOW D1819" manufactured by BASF SE)), 800 parts of ground salt, and 180 parts of diethylene glycol were added in a 1-gallon stainless steel kneader (by INOUE MFG., INC.), and kneaded at 70° C. for 4 hours. This mixture was poured into 3,000 parts of warm water and stirred by a high-speed mixture for about 1 hour while heating at about 80° C. to form a slurry-like material, which was then filtered and washed with water repeatedly to remove the salt and the solvent. Then, the obtained product was dried at 80° C. for 24 hours to obtain 96 parts of a yellow micronized pigment (Y1).

<Method for Producing Pigment Dispersions>

(Production Example of Green Pigment Dispersion (GP-1))

The mixture shown below was uniformly mixed with stirring, and dispersed for 5 hours by a paint shaker S0400 (manufactured by Skandex) using zirconia beads having a diameter of 1 mm. Thereafter, 30.0 parts of methoxypropyl acetate was added, followed by filtering through a 5 μm filter to obtain a green pigment dispersion (GP-1).

C. I. Pigment Green 58: 7.5 parts
("FASTOGEN GREEN A110" manufactured by DIC Corporation)
C. I. Pigment Yellow 150: 7.5 parts
("E4GN" manufactured by LANXESS)
Dispersant (b1-1) having acidic functional group: 10.0 parts
Methoxypropyl acetate: 75.0 parts.

(Preparation of Green Pigment Dispersions (GP-2 to 21))

Green pigment dispersions (GP-2 to 21) were obtained in the same manner as the green pigment dispersion (GP-1) except that the compositions and amounts (parts by weight) were changed as shown in Table 2.

[Pigment (A)]
PG58: "FASTOGEN GREEN A110" manufactured by DIC Corporation
PG36: "CF-G-6YK" manufactured by TOYOCOLOR CO., LTD.
PG7: "Fastgen Green S" manufactured by DIC Corporation
PY150: "E4GN" manufactured by LANXESS
PY139: Yellow micronized pigment (Y1)
[Dispersant b1 Having Acidic Functional Group]
BYK-111: "DISPERBYK-111" manufactured by BYK
BYK-174: "DISPERBYK-174" manufactured by BYK
[Dispersant b2 Having Basic Functional Group]
BYK-2150: "DISPERBYK-2150" manufactured by BYK
BYK-2000: "DISPERBYK-2000" manufactured by BYK
EFKA-4300: "Efka 4300" manufactured by BASF SE Example 1

(Preparation of Thermosetting Coloring Composition (GT-1))

The mixture (100 parts in total) below was uniformly mixed with stirring, followed by filtering through a 1.0 μm filter to obtain a thermosetting coloring composition (GT-1).
Pigment Dispersion (GP-1): 77.2 parts
Thermosetting Compound C: 1.6 parts
"Denacol EX-611" manufactured by Nagase ChemteX Corporation Leveling agent solution: 1.0 part
"FZ-2122" manufactured by Dow Corning Toray Co., Ltd.
(Solution obtained by diluting 1 part (100% by weight of nonvolatile content) with 99 parts of cyclohexanone)
Solvent D: 10.2 parts
Methoxypropyl acetate
Solvent d1: 10.0 parts
Cyclohexanol acetate

TABLE 2

| | PIGMENT | | | | | DISPERSANT (b1) HAVING ACIDIC FUNCTIONAL GROUP | | DISPERSANT (b2) HAVING BASIC FUNCTIONAL GROUP | | ACRYLIC RESIN SOLUTION 1 | METHOXYPROPYL ACETATE |
|---|---|---|---|---|---|---|---|---|---|---|---|
| | PG58 | PG36 | PG7 | PG150 | PG139 | | | | | | |
| GP-1 | 7.5 parts | | | 7.5 parts | | b1-1 | 10.0 parts | | | | 75.0 parts |
| GP-2 | 7.5 parts | | | 7.5 parts | | b11-1 | 10.0 parts | | | | 75.0 parts |
| GP-3 | 7.5 parts | | | 7.5 parts | | b11-2 | 10.0 parts | | | | 75.0 parts |
| GP-4 | 7.5 parts | | | 7.5 parts | | b11-3 | 10.0 parts | | | | 75.0 parts |
| GP-5 | 7.5 parts | | | 7.5 parts | | BYK-111 | 5.0 parts | | | | 80.0 parts |
| GP-6 | 7.5 parts | | | 7.5 parts | | BYK-174 | 9.4 parts | | | | 75.6 parts |
| GP-7 | 7.5 parts | | | 7.5 parts | | | | BYK2150 | 9.6 parts | | 75.4 parts |
| GP-8 | 7.5 parts | | | 7.5 parts | | | | BYK2000 | 12.5 parts | | 72.5 parts |
| GP-9 | 7.5 parts | | | 7.5 parts | | | | EFKA-4300 | 5.0 parts | | 80.0 parts |
| GP-10 | 7.5 parts | | | 7.5 parts | | b11-3 | 5.0 parts | BYK2150 | 4.8 parts | | 75.2 parts |
| GP-11 | 7.5 parts | | | 7.5 parts | | BYK-111 | 2.5 parts | BYK2000 | 6.3 parts | | 76.2 parts |
| GP-12 | 10.5 parts | | | 4.5 parts | | b11-3 | 5.0 parts | BYK2150 | 4.8 parts | | 75.2 parts |
| GP-13 | | 7.5 parts | | 7.5 parts | | b11-3 | 5.0 parts | BYK2150 | 4.8 parts | | 75.2 parts |
| GP-14 | 9.0 parts | | | 3.0 parts | 3.0 parts | b11-3 | 5.0 parts | BYK2150 | 4.8 parts | | 75.2 parts |
| GP-15 | 9.0 parts | | 1.5 parts | 4.5 parts | | b11-3 | 5.0 parts | BYK2150 | 4.8 parts | | 75.2 parts |
| GP-16 | 7.5 parts | | | 7.5 parts | | b11-3 | 4.0 parts | BYK2150 | 3.8 parts | 5.0 parts | 70.2 parts |
| GP-17 | 7.5 parts | | | 7.5 parts | | | | | | 25.0 parts | 60.0 parts |
| GP-18 | 7.5 parts | | | 7.5 parts | | b11-4 | 10.0 parts | | | | 75.0 parts |
| GP-19 | 7.5 parts | | | 7.5 parts | | b11-5 | 10.0 parts | | | | 75.0 parts |
| GP-20 | | 7.5 parts | | 7.5 parts | | b11-3 | 10.0 parts | | | | 75.0 parts |
| GP-21 | | 10.5 parts | | 4.5 parts | | b11-3 | 10.0 parts | | | | 75.0 parts |

Examples 2 to 28 and Comparative Examples 1 to 6

(Preparation of Thermosetting Coloring Compositions (GT-2 to GT-34))

The thermosetting coloring compositions (GT-2 to GT-34) were obtained in the same manner as the thermosetting coloring composition (GT-1) except that the compositions and blending amounts (parts by weight) were changed as shown in Tables 3 to 5.

TABLE 3

|  | EXAMPLE 1 GT-1 | EXAMPLE 2 GT-2 | EXAMPLE 3 GT-3 | EXAMPLE 4 GT-4 | EXAMPLE 5 GT-5 | EXAMPLE 6 GT-6 | EXAMPLE 7 GT-7 | EXAMPLE 8 GT-8 | EXAMPLE 9 GT-9 | EXAMPLE 10 GT-10 |
|---|---|---|---|---|---|---|---|---|---|---|
| PIGMENT DISPERSION | | | | | | | | | | |
| GP-1 | 77.2 parts | | | | | | | | | |
| GP-2 | | 77.2 parts | | | | | | | | |
| GP-3 | | | 77.2 parts | | | | | | | |
| GP-4 | | | | 77.2 parts | | | | | | |
| GP-5 | | | | | 77.2 parts | | | | | |
| GP-6 | | | | | | 77.2 parts | | | | |
| GP-7 | | | | | | | 77.2 parts | | | |
| GP-8 | | | | | | | | 77.2 parts | | |
| GP-9 | | | | | | | | | 77.2 parts | |
| GP-10 | | | | | | | | | | 77.2 parts |
| GP-11 | | | | | | | | | | |
| GP-12 | | | | | | | | | | |
| GP-13 | | | | | | | | | | |
| GP-14 | | | | | | | | | | |
| GP-15 | | | | | | | | | | |
| GP-16 | | | | | | | | | | |
| GP-17 | | | | | | | | | | |
| THERMOSETTING COMPOUND C | | | | | | | | | | |
| EX-611 | 1.6 parts | 1.6 parts | 1.6 parts | 1.6 parts | 1.6 parts | 1.6 parts | 1.6 parts | 1.6 parts | 1.6 parts | 1.6 parts |
| EX-612 | | | | | | | | | | |
| EX-614 | | | | | | | | | | |
| EX-614B | | | | | | | | | | |
| EX-622 | | | | | | | | | | |
| EX-411 | | | | | | | | | | |
| EX-512 | | | | | | | | | | |
| EHPE3150 | | | | | | | | | | |
| ACRYLIC RESIN SOLUTION | | | | | | | | | | |
| LEVELING AGENT SOLUTION SOLVENT D | 1.0 part | 1.0 part | 1.0 part | 1.0 part | 1.0 part | 1.0 part | 1.0 part | 1.0 part | 1.0 part | 1.0 part |
| METHOXYPROPYL ACETATE SOLVENT (d1) HAVING BOILING POINT OF 160° C. OR MORE | 10.2 parts | 10.2 parts | 10.2 parts | 10.2 parts | 10.2 parts | 10.2 parts | 10.2 parts | 10.2 parts | 10.2 parts | 10.2 parts |
| CYCLOHEXANOL ACETATE EEP | 10.0 parts | 10.0 parts | 10.0 parts | 10.0 parts | 10.0 parts | 10.0 parts | 10.0 parts | 10.0 parts | 10.0 parts | 10.0 parts |

TABLE 4

|  | EXAMPLE 11 GT-11 | EXAMPLE 12 GT-12 | EXAMPLE 13 GT-13 | EXAMPLE 14 GT-14 | EXAMPLE 15 GT-15 | EXAMPLE 16 GT-16 | EXAMPLE 17 GT-17 | EXAMPLE 18 GT-18 | EXAMPLE 19 GT-19 | EXAMPLE 20 GT-20 |
|---|---|---|---|---|---|---|---|---|---|---|
| PIGMENT DISPERSION | | | | | | | | | | |
| GP-1 | | | | | | | | | | |
| GP-2 | | | | | | | | | | |

TABLE 4-continued

| | EXAMPLE 11 GT-11 | EXAMPLE 12 GT-12 | EXAMPLE 13 GT-13 | EXAMPLE 14 GT-14 | EXAMPLE 15 GT-15 | EXAMPLE 16 GT-16 | EXAMPLE 17 GT-17 | EXAMPLE 18 GT-18 | EXAMPLE 19 GT-19 | EXAMPLE 20 GT-20 |
|---|---|---|---|---|---|---|---|---|---|---|
| GP-3 | | | | | | | | | | |
| GP-4 | | | | | | | | | | |
| GP-5 | | | | | | | | | | |
| GP-6 | | | | | | | | | | |
| GP-7 | | | | | | | | | | |
| GP-8 | | | | | | | | | | |
| GP-9 | | | | | | | | | | |
| GP-10 | | | | | | | 77.2 parts | 77.2 parts | 77.2 parts | 77.2 parts |
| GP-11 | 77.2 parts | | | | | | | | | |
| GP-12 | | 77.2 parts | | | | | | | | |
| GP-13 | | | 77.2 parts | | | | | | | |
| GP-14 | | | | 77.2 parts | | | | | | |
| GP-15 | | | | | 77.2 parts | | | | | |
| GP-16 | | | | | | 77.2 parts | | | | |
| GP-17 | | | | | | | | | | |
| THERMOSETTING COMPOUND C | | | | | | | | | | |
| EX-611 | 1.6 parts | 1.6 parts | 1.6 parts | 1.6 parts | 1.6 parts | 1.6 parts | | | | |
| EX-612 | | | | | | | 1.6 parts | | | |
| EX-614 | | | | | | | | 1.6 parts | | |
| EX-614B | | | | | | | | | 1.6 parts | |
| EX-622 | | | | | | | | | | 1.6 parts |
| EX-411 | | | | | | | | | | |
| EX-512 | | | | | | | | | | |
| EHPE3150 | | | | | | | | | | |
| ACRYLIC RESIN SOLUTION | | | | | | | | | | |
| LEVELING AGENT SOLUTION SOLVENT D | 1.0 part | 1.0 part | 1.0 part | 1.0 part | 1.0 part | 1.0 part | 1.0 part | 1.0 part | 1.0 part | 1.0 part |
| METHOXYPROPYL ACETATE SOLVENT (d1) HAVING BOILING POINT OF 160° C. OR MORE | 10.2 parts | 10.2 parts | 10.2 parts | 10.2 parts | 10.2 parts | 10.2 parts | 10.2 parts | 10.2 parts | 10.2 parts | 10.2 parts |
| CYCLOHEXANOL ACETATE EEP | 10.0 parts | 10.0 parts | 10.0 parts | 10.0 parts | 10.0 parts | 10.0 parts | 10.0 parts | 10.0 parts | 10.0 parts | 10.0 parts |

TABLE 5

| | EXAMPLE 21 GT-21 | EXAMPLE 22 GT-22 | EXAMPLE 23 GT-23 | EXAMPLE 24 GT-24 | EXAMPLE 25 GT-31 | EXAMPLE 26 GT-32 | EXAMPLE 27 GT-33 | EXAMPLE 28 GT-34 | COMPARATIVE EXAMPLE 1 GT-25 | COMPARATIVE EXAMPLE 2 GT-26 | COMPARATIVE EXAMPLE 3 GT-27 | COMPARATIVE EXAMPLE 4 GT-28 | COMPARATIVE EXAMPLE 5 GT-29 | COMPARATIVE EXAMPLE 6 GT-30 |
|---|---|---|---|---|---|---|---|---|---|---|---|---|---|---|
| PIGMENT DISPERSION | | | | | | | | | | | | | | |
| GP-1 | | | | | | | | | | | | | | |
| GP-2 | | | | | | | | | | | | | | |
| GP-3 | | | | | | | | | | | | | | |
| GP-4 | | | | | | | | | | | | | | |
| GP-5 | | | | | | | | | | | | | | |
| GP-6 | | | | | | | | | | | | | | |
| GP-7 | | | | | | | | | | | | | | |
| GP-8 | | | | | | | | | | | | | | |
| GP-9 | | | | | | | | | | | | | | |
| GP-10 | 77.2 parts | 77.2 parts | 69.0 parts | 81.0 part | | | | | | 77.3 parts | 77.4 parts | 77.4 parts | 77.4 parts | 85.0 parts |
| GP-11 | | | | | | | | | | | | | | |
| GP-12 | | | | | | | | | | | | | | |
| GP-13 | | | | | | | | | | | | | | |
| GP-14 | | | | | | | | | | | | | | |
| GP-15 | | | | | | | | | | | | | | |
| GP-16 | | | | | | | | | | | | | | |
| GP-17 | | | | | 77.2 parts | | | | 77.2 parts | | | | | |
| GP-18 | | | | | | 77.2 parts | | | | | | | | |
| GP-19 | | | | | | | 77.2 parts | | | | | | | |
| GP-20 | | | | | | | | 77.2 parts | | | | | | |
| GP-21 | | | | | | | | | | | | | | |
| THERMOSETTING COMPOUND C | | | | | | | | | | | | | | |
| EX-611 | 1.6 parts | 1.6 parts | 3.2 parts | 0.8 parts | 1.6 parts | 1.6 parts | 1.6 parts | 1.6 parts | 1.6 parts | | | | | |
| EX-612 | | | | | | | | | | | | | | |
| EX-614 | | | | | | | | | | | | | | |
| EX-614B | | | | | | | | | | | | | | |
| EX-622 | | | | | | | | | | | | | | |
| EX-411 | | | | | | | | | | 1.6 parts | | | | |
| EX-512 | | | | | | | | | | | 1.6 parts | | | |
| EHPE3150 | | | | | | | | | | | | 1.6 parts | | |
| ACRYLIC RESIN SOLUTION | | | | | | | | | | | | | 8.0 parts | |
| LEVELING AGENT SOLUTION D | 1.0 part | 1.0 part | 1.0 part | 1.0 part | 1.0 part | 1.0 part | 1.0 part | 1.0 part | 1.0 part | 1.0 part | 1.0 part | 1.0 part | 1.0 part | 1.0 part |
| METHOXYPROPYL ACETATE SOLVENT (d1) | 10.2 parts | 20.2 parts | 16.8 parts | 7.2 parts | 10.2 parts | 10.2 parts | 10.2 parts | 10.2 parts | 10.2 parts | 10.2 parts | 10.2 parts | 10.2 parts | 3.8 parts | 4.0 parts |

TABLE 5-continued

| | EXAMPLE 21 GT-21 | EXAMPLE 22 GT-22 | EXAMPLE 23 GT-23 | EXAMPLE 24 GT-24 | EXAMPLE 25 GT-31 | EXAMPLE 26 GT-32 | EXAMPLE 27 GT-33 | EXAMPLE 28 GT-34 | COMPARATIVE EXAMPLE 1 GT-25 | COMPARATIVE EXAMPLE 2 GT-26 | COMPARATIVE EXAMPLE 3 GT-27 | COMPARATIVE EXAMPLE 4 GT-28 | COMPARATIVE EXAMPLE 5 GT-29 | COMPARATIVE EXAMPLE 6 GT-30 |
|---|---|---|---|---|---|---|---|---|---|---|---|---|---|---|
| HAVING BOILING POINT OF 160° C. OR MORE | | | | | | | | | | | | | | |
| CYCLOHEXANOL ACETATE | 10.0 parts | | | | | | | | | | | | | |
| EEP | | | 10.0 parts | 10.0 parts | 10.0 parts | 10.0 parts | 10.0 parts | 10.0 parts | 10.0 parts | 10.0 parts | 10.0 parts | 10.0 parts | 10.0 parts | 10.0 parts |

[Thermosetting Compound (C)]

The thermosetting compounds (C) used are shown in Table 6 below.

TABLE 6

| | | |
|---|---|---|
| EX-611 | "Denacol EX-611" manufactured by Nagase ChemteX Corporation | GLYCIDYL ETHERIFIED EPOXY COMPOUND OF SORBITOL |
| EX-612 | "Denacol EX-612" manufactured by Nagase ChemteX Corporation | GLYCIDYL ETHERIFIED EPOXY COMPOUND OF SORBITOL |
| EX-614 | "Denacol EX-614" manufactured by Nagase ChemteX Corporation | GLYCIDYL ETHERIFIED EPOXY COMPOUND OF SORBITOL |
| EX-614B | "Denacol EX-614B" manufactured by Nagase ChemteX Corporation | GLYCIDYL ETHERIFIED EPOXY COMPOUND OF SORBITOL |
| EX-622 | "Denacol EX-622" manufactured by Nagase ChemteX Corporation | GLYCIDYL ETHERIFIED EPOXY COMPOUND OF SORBITOL |
| EX-411 | "Denacol EX-411" manufactured by Nagase ChemteX Corporation | GLYCIDYL ETHERIFIED EPOXY COMPOUND OF PENTAERYTHRITOL |
| EX-512 | "Denacol EX-512" manufactured by Nagase ChemteX Corporation | GLYCIDYL ETHERIFIED EPOXY COMPOUND OF POLYGLYCEROL |
| EHPE3150 | "EHPE 3150" manufactured by Daicel Corporation | CONDENSATION PRODUCTS OF 1,2-EPOXY-4-(2-OXIRANYL)CYCLOHEXANE OF 2,2-BIS(HYDROXY METHYL)-1-BUTANOL |

[Solvent (D)]

EEP: "Euka Ester EEP" manufactured by The Dow Chemical Company

The thermosetting coloring compositions in the examples and comparative examples were evaluated with respect to the viscosity stability, resistance to stripping liquid, and coating film foreign substances. In the following, ⊚ (double circle) denotes extremely excellent characteristics, ○(circle) denotes excellent characteristics inferior to ⊚, Δ (triangle) denotes practically-usable characteristics inferior to ○, and x (cross) denotes that it is not suitable for practical use.

<Evaluation of Viscosity Stability>

The viscosity at 25° C. immediately after preparation of the thermosetting coloring composition and the viscosity after storage for 1 month in a thermostat chamber at 13° C. were measured using an E-type viscometer (TUE-20L model manufactured by TOKI SANKGYO CO., LTD.) at a rotational frequency of 20 rpm. The viscosity on the day of preparation of the coloring composition was defined as an initial viscosity (η0: mPa·s), and the viscosity after storage for 1 month in a thermostat chamber at 13° C. was defined as a viscosity (η1: mPa·s), and the dispersion stability was evaluated based on the following criteria.

⊚: η1/η0 being 1.10 or less

○: η1/η0 being 1.10 or more and 1.20 x: η1/η0 being 1.20 or more

<Evaluation 1 of Stripping Liquid Resistance>

The obtained thermosetting coloring composition was applied to a glass substrate having a size of 100 mm×100 mm and a thickness of 1.1 mm by using a spin coater to have a dry coating film of 0.7 μm which was heated and baked in an oven at 230° C. for 30 minutes. It was immersed in a stripping liquid (a mixed solution of N-methylpyrrolidone/dimethylsulfoxide=4/6) for 1 minute, 3 minutes, and 5 minutes, and then observed with an optical microscope for evaluation. The rank of the evaluation is as follows.

⊚: Good with no change in appearance in 5 minutes

○: Good with no change in appearance in 1 minute and 3 minutes, but cracking, surface roughness, or a foreign substance occurred in 5 minutes Δ: Good with no change in appearance in 1 minute, but cracking, surface roughness, or a foreign substance occurred in 3 minutes x: Cracking, surface roughness, or a foreign substance occurred <Evaluation 2 of Stripping Liquid Resistance>

The obtained thermosetting coloring composition was applied to a glass substrate having a size of 100 mm×100 mm and a thickness of 1.1 mm by using a spin coater to have a dry coating film of 0.7 μm which was heated and baked in an oven at 230° C. for 30 minutes. It was immersed in a stripping liquid (a mixed solution of N-methylpyrrolidone/monoethanolamine=5/5) for 1 minute, 3 minutes, and 5 minutes, and then observed with an optical microscope. The rank of the evaluation is as follows.

⊚: Good with no change in appearance in 5 minutes

○: Good with no change in appearance in 1 minute and 3 minutes, but cracking, surface roughness, or a foreign substance occurred in 5 minutes Δ: Good with no change in appearance in 1 minute, but cracking, surface roughness, or a foreign substance occurred in 3 minutes x: Cracking, surface roughness, or a foreign substance occurred <Evaluation of Coating Film Foreign Substances>

The obtained thermosetting coloring composition was applied to a glass substrate having a size of 100 mm×100 mm and a thickness of 1.1 mm by using a spin coater such that the dry coating film was 0.7 μm, and the obtained coated substrate was visually observed to evaluate the foreign substances.

⊚: No foreign substance on the substrate

○: Not less than one and less than five foreign substances on the substrate x: Not less than five foreign substances on the substrate The thermosetting coloring compositions (GT-1 to GT-34) were used to perform evaluation according to the above procedure. The results are shown in Table 7.

TABLE 7

| | EXAMPLE 1 | EXAMPLE 2 | EXAMPLE 3 | EXAMPLE 4 | EXAMPLE 5 | EXAMPLE 6 | EXAMPLE 7 | EXAMPLE 8 | EXAMPLE 9 | EXAMPLE 10 |
|---|---|---|---|---|---|---|---|---|---|---|
| <EVALUATION OF VISCOSITY STABILITY> | ○ | ○ | ○ | ○ | ○ | ○ | ○ | ○ | ○ | ○ |
| <EVALUATION 1 OF STRIPPING LIQUID RESISTANCE> | ○ | ○ | ○ | ○ | ○ | ○ | ○ | ○ | ○ | ○ |
| <EVALUATION 2 OF STRIPPING LIQUID RESISTANCE> | ○ | ○ | ○ | ○ | ○ | ○ | ○ | ○ | ○ | ○ |
| <EVALUATION OF COATING FILM FOREIGN SUBSTANCES> | ◎ | ◎ | ◎ | ◎ | ◎ | ◎ | ◎ | ◎ | ◎ | ◎ |

| | EXAMPLE 11 | EXAMPLE 12 | EXAMPLE 13 | EXAMPLE 14 | EXAMPLE 15 | EXAMPLE 16 | EXAMPLE 17 | EXAMPLE 18 | EXAMPLE 19 | EXAMPLE 20 |
|---|---|---|---|---|---|---|---|---|---|---|
| <EVALUATION OF VISCOSITY STABILITY> | ◎ | ◎ | ◎ | ◎ | ◎ | ◎ | ◎ | ◎ | ◎ | ◎ |
| <EVALUATION 1 OF STRIPPING LIQUID RESISTANCE> | ○ | ○ | ○ | ○ | ○ | ○ | ○ | ○ | ○ | ○ |
| <EVALUATION 2 OF STRIPPING LIQUID RESISTANCE> | ○ | ○ | ○ | ○ | ○ | ○ | ○ | ○ | ○ | ○ |
| <EVALUATION OF COATING FILM FOREIGN SUBSTANCES> | ◎ | ◎ | ◎ | ◎ | ◎ | ◎ | ◎ | ◎ | ◎ | ◎ |

| | EXAMPLE 21 | EXAMPLE 22 | EXAMPLE 23 | EXAMPLE 24 | EXAMPLE 25 | EXAMPLE 26 | EXAMPLE 27 | EXAMPLE 28 | COMPARATIVE EXAMPLE 1 | COMPARATIVE EXAMPLE 2 | COMPARATIVE EXAMPLE 3 | COMPARATIVE EXAMPLE 4 | COMPARATIVE EXAMPLE 5 | COMPARATIVE EXAMPLE 6 |
|---|---|---|---|---|---|---|---|---|---|---|---|---|---|---|
| <EVALUATION OF VISCOSITY STABILITY> | ◎ | ◎ | ◎ | ◎ | ○ | ○ | ○ | ○ | X | ◎ | ◎ | ◎ | ◎ | ◎ |
| <EVALUATION 1 OF STRIPPING LIQUID RESISTANCE> | ○ | ○ | ○ | ○ | ◎ | △ | ○ | ○ | ○ | X | X | X | X | X |
| <EVALUATION 2 OF STRIPPING LIQUID RESISTANCE> | ○ | ○ | ○ | ○ | ◎ | △ | ○ | ○ | ○ | X | X | X | X | X |
| <EVALUATION OF COATING FILM FOREIGN SUBSTANCES> | ○ | △ | ◎ | ◎ | ◎ | ◎ | ◎ | ◎ | ◎ | ◎ | ◎ | ◎ | ◎ | ◎ |

According to Table 7, the thermosetting coloring compositions within the range of the present invention were excellent in terms of viscosity stability, stripping liquid resistance, and coating film foreign substances.

As shown in Example 25, the stripping liquid resistance is particularly excellent when the theoretical value of the glass transition temperature of the segment (b1-A) obtained by polymerizing the ethylenic unsaturated monomer containing (meth)acrylate contained in the dispersant is 80° C. or higher.

The invention claimed is:

1. A thermosetting coloring composition for manufacturing a color filter for a solid-state imaging element provided with a colored pattern formed by patterning a colored layer by dry etching, the composition comprising:
   a pigment (A), a dispersant (B), a thermosetting compound (C), and a solvent (D),
   wherein a ratio of the pigment (A) to a total solid content of the themiosetting coloring composition is 50 mass percent or more, the dispersant (B) comprises a dispersant (b1) having an acidic functional group, and the thermosetting compound (C) comprises a glycidyl etherified epoxy compound of sorbitol,
   wherein the dispersant (b1) having the acidic functional group has a segment (b1-A) obtained by polymerizing an ethylenic unsaturated monomer comprising (meth)acrylate, and a theoretical value of a glass transition temperature of the segment (b1-A) is 40° C. or higher.

2. The thermosetting coloring composition according to claim 1, wherein the pigment (A) comprises a green pigment (a1).

3. The thermosetting coloring composition according to claim 2, wherein the green pigment comprises at least one selected from the group consisting of Pigment Green 7, Pigment Green 36, and Pigment Green 58.

4. The thermosetting coloring composition according to claim 1, wherein the solvent (D) comprises a solvent (d1) having a boiling point of 160° C. or higher.

5. The thermosetting coloring composition according to claim 4, wherein the solvent (d1) having a boiling point of 160° C. or higher is cyclohexanol acetate.

6. The thermosetting coloring composition according to claim 1, wherein the acidic functional group is an aromatic carboxyl group.

7. The thermosetting coloring composition according to claim 1, wherein the theoretical value of the glass transition temperature of the segment (b1-A) is 80° C. or higher.

8. A method of manufacturing a color filter for a solid-state imaging element, the method comprising:
   (X) forming a colored layer using the thermosetting coloring composition according to claim 1; and
   (Y) patterning the colored layer by dry etching.

9. The method according to claim 8,
   wherein (X) includes (X-1) forming a coating film comprising the thermosetting coloring composition, and (X-2) thermally curing the coating film to obtain the colored layer, and
   (Y) includes (Y-1) forming a photoresist layer on the colored layer, (Y-2) patterning the photoresist layer by performing exposure and development to obtain a resist pattern, (Y-3) patterning the colored layer by dry etching using the resist pattern as an etching mask to form a colored pattern, and (Y-4) bringing a stripping liquid into contact with the resist pattern to remove the resist pattern from the colored pattern.

10. The method according to claim 9, wherein the stripping liquid comprises at least one selected from the group consisting of N-methylpyrrolidone, dimethylsulfoxide, and monoethanolamine.

11. The thermosetting coloring composition according to claim 1, wherein the dispersant (B) further comprises a dispersant (b2) having a basic functional group.

* * * * *